United States Patent [19]

Ushiki et al.

[11] Patent Number: 5,097,983

[45] Date of Patent: Mar. 24, 1992

[54] SUPPLY DEVICE USED IN A SEMICONDUCTOR ASSEMBLY APPARATUS

[75] Inventors: Hiroshi Ushiki, Saitama; Takashi Endo; Hiroyuki Matuno, both of Tokyo, all of Japan

[73] Assignee: Kabushiki Kaisha Shinkawa, Tokyo, Japan

[21] Appl. No.: 625,839

[22] Filed: Dec. 11, 1990

[30] Foreign Application Priority Data

Dec. 11, 1989 [JP] Japan .................... 1-318804

[51] Int. Cl.$^5$ ............................. B65H 3/00
[52] U.S. Cl. ..................... 221/21; 221/242; 221/270; 221/272
[58] Field of Search ............. 221/21, 151, 153, 208, 221/209, 241, 242, 224, 258, 268, 270, 272; 414/753, 796.8, 797.9

[56] References Cited

U.S. PATENT DOCUMENTS

| | | | |
|---|---|---|---|
| 3,100,583 | 8/1963 | Erickson | 221/241 |
| 4,693,659 | 9/1987 | Burke et al. | 414/753 |
| 4,717,304 | 1/1988 | Bocchicchio et al. | 221/11 |
| 4,861,227 | 8/1989 | Cinotti | 414/796.8 |
| 4,877,367 | 10/1989 | Cinotti | 414/796.8 |

*Primary Examiner*—H. Grant Skaggs
*Attorney, Agent, or Firm*—Koda and Androlia

[57] ABSTRACT

A workpiece supply device used in semiconductor assembly machines such as wire bonding device, pellet bonding device, etc. including an elevator section having an elevator table that is raised and lowered and carries a magazine accommodated therein plate-form workpieces, a magazine stacker which guides the magazine, and a pusher assembly including a pusher arm pushing the workpiece out of the magazine one at a time. The magazine stacker is made up with a fixed guide and a movable guide. The movable guide is adjustable size wise in a direction wherein the workpiece is pushed out, and the pusher device is provided on the movable guide. Power source for the pusher device is installed parallel to the workpieces piled up in the magazine.

3 Claims, 4 Drawing Sheets

SUPPLY DEVICE USED IN A SEMICONDUCTOR ASSEMBLY APPARATUS

BACKGROUND OF THE INVENTION

1. Field of the Invention

The present invention relates to a supply device for use in a semiconductor assembly machine wherein plate-form workpieces are pushed out one at a time from a magazine.

2. Prior Art

The supply of plate-form workpieces in, for example, wire bonding devices, pellet bonding devices, etc. employed in a semiconductor assembling machine ordinarily uses a magazine in which a multiple number of plate form workpieces such as lead frames, etc. are piled or stacked up. The magazine is placed on an elevator table of an elevator section of the assembly machine, and the workpieces are successively positioned at a height of a feeder in accordance with the stacking interval of the workpieces. The workpieces are pushed out to the feeder from the magazine by a push arm of a pushing device.

In conventional supply devices as described above, the pusher is directly fixed to a predetermined position of the elevator section, and an air cylinder is generally used as a driving source for the pusher arm. The air cylinder is installed horizontally. Furthermore, no consideration is given to workpieces which are caught inside the magazine or on the feeder which would occur when the workpiece is pushed out.

In the prior art, since the pusher is directly secured to a predetermined portion of the elevator section, if a magazine of different size is used because of the differences in the type of workpiece to be processed, the position of the pusher arm must be independently adjusted every time the workpieces of different sizes are handled, and a level adjustment work is also required. These adjustments take time. As a result, the working efficiency drops.

In addition, since the driving source of the pusher is a horizontally installed air cylinder, the size of the supply device for used in a semiconductor assembly machine as a whole tends to be large, resulting in a poor space efficiency.

Furthermore, since in the prior art no consideration has been given to troubles such as "hanging-up" of the workpieces, the workpieces tend to be damaged.

SUMMARY OF THE INVENTION

Accordingly, it is a first object of the present invention to provide a workpiece supply device used in a semiconductor assembly machines that requires no independent adjustment of workpiece pusher even when the size of the magazine changes, shortening the time required for the level or height adjustment.

It is a second object of the present invention to provide a workpiece supply device for a semiconductor assembly machine which is compact and therefore has a good space efficiency.

It is a third object of the present invention to provide a workpiece supply device for a semiconductor assembly apparatus which prevents damages to the workpieces.

In order to accomplish the first object of the present invention, a magazine stacker that guides an elevator section is assembled with a fixed guide and a movable guide which is adjustable in the direction the workpieces are pushed out, and a pusher is mounted to the movable guide.

In order to accomplish the second object, a driving source for the pusher is set along the direction in which the workpieces are piled up.

In order to accomplish the third object, an elastic member and a linking member are provided on an action-linking means which transmits the action of the driving source to the pusher arm, and a detection means is utilized to detect displacements of the action-linking means that is caused by deformation of the elastic member.

Since the pusher is mounted on the movable guide, the position of the pusher can be adjusted merely by moving the movable guide (which guides and supports the magazine) when the size of the magazine changes due to different size of workpieces. As a result, the pusher moved along with the movable guide is automatically set, and any independent adjustment for the pusher is thus unnecessary.

Since the magazines with workpieces are usually long in the vertical direction, the overall size of the apparatus can be more compact by installing the driving source vertically. Thus, the space efficiency can be improved.

If a workpiece is somehow hung up or caught during the pushing-out operation of the workpieces, an excess amount of load is applied on the pusher arm, and the elastic member is deformed accordingly, resulting in a displacement of the linking member. Such a displacement of the linking member, however, is detected by the detection means, and the action of the driving source is stopped or reversed in accordance with the resulting detection signal. As a result, the advance or forward movement of the pusher arm is stopped or the pusher arm is retracted. Thus, the workpiece is prevented from being damaged.

BRIEF DESCRIPTION OF THE DRAWINGS

FIGS. 1 and 2 illustrate one embodiment of the supply device used in a semiconductor assembly apparatus according to the present invention, wherein FIG. 1 is a front view, and FIG. 2 is a top view;

DETAILED DESCRIPTION OF THE INVENTION

Figure 1:
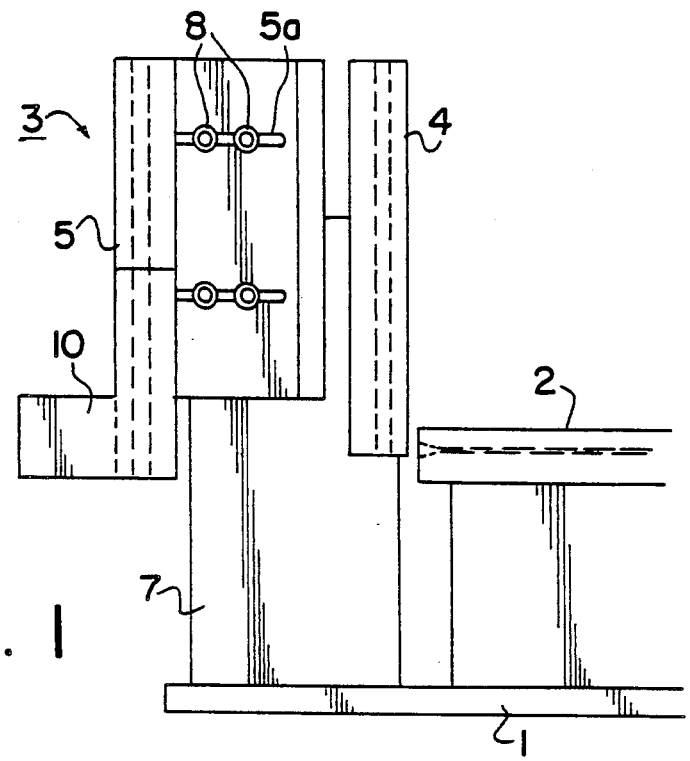
Figure 2:
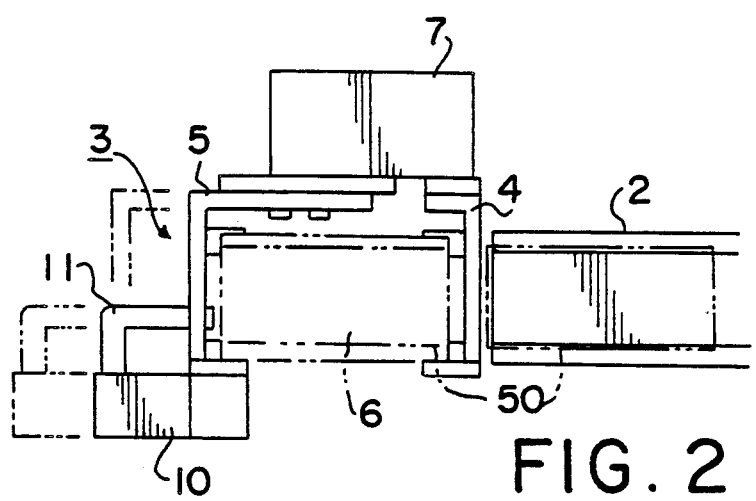

As shown in FIGS. 1 and 2, a feeder assembly 2 which supplies workpieces to a processing device (not shown) is fixed to a base plate 1, and a magazine stacker 3 is installed adjacent to one end of this feeder assembly 2.

The magazine stacker 3 guides and supports a magazine 6 in which a multiple number of workpieces 50 are piled or stacked up. The magazine stacker 3 includes a fixed guide 4 and a movable guide 5 which is installed in a manner to face the fixed guide 4.

An elevator section 7 fixed to the base 1 is positioned next to the magazine stacker 3. The elevator section 7 of well known structure has an elevator table (not shown) that can be automatically raised and lowered. The fixed guide 4 is fixed to a fixing position of the elevator section 7.

The movable guide 5 has slots 5a and is fastened to a fixing portion of the elevator section 7 by screws 8. The movable guide 5 is thus adjustable so as to meet with the size of magazines 6 which varies (size wise) based upon the type of workpiece 50 piled therein.

A pusher assembly 10 is provided on the movable guide 5. The pusher assembly 10 has a pusher arm 11 that pushes the workpieces out of the magazine 6 onto the feeder assembly 2.

Since the pusher assembly 10 is provided on the movable guide 5, it can move together with the movable guide 5 when the movable guide 5 (which guides and supports the magazine 6) is moved so as to be adjusted along the slots 5a depending upon the size of the magazine 6. Accordingly, the pusher assembly 10 is set automatically when the movable guide 5 is moved, and no independent adjustment thereof is required.

The structure of the pusher assembly 10 is shown in detail in FIGS. 3 through 6.

A bracket 12 is fixed to the movable guide 5, and an air cylinder 13 is installed in an upright position (or vertically) on this bracket 12. In other words, the air cylinder 13 is oriented in the same direction as the piled or stacked workpieces in the magazine 6.

A bridge member 14 is attached to the tip end of the piston 13a of the air cylinder 13. A guide rod 15 is installed parallel to the air cylinder 13, and both ends thereof are fixed to the bracket 12. The bridge member 14 is guided by the guide rod 15 and moves up and down.

A first roller 16 which has two grooves is rotatably provided on the bridge member 14. A second roller 17 which has one groove is rotatably provided on the upper end of the bracket 12. A third roller 18 which has two grooves is rotatably provided on the lower end of the bracket 12. The third roller 18 is positioned perpendicular to the first roller 16 and second roller 17.

A linear guide 25 is secured horizontally to an extended arm of the bracket 12. The arm is horizontally positioned at the bottom of the bracket 12. On the linear guide 25, a bearing 26 is rotatably installed.

A slider 27 is provided on the bearing 26, and the pusher arm 11 is fixed to this slider 27. A fourth roller 28 is rotatably installed at the tip end of the extended arm at the bottom of the bracket 12.

A swing member 29 is rotatably supported by a supporting shaft 30 at one position of the bracket 12 located between the first roller 16 and the third roller 18. A coil spring 32 is installed between one end of the swing member 29 and a spring hook 31 provided on the bracket 12. A detection piece 33 is attached to the swing member 29, and a proximity switch 34 is provided on the bracket 12 so that the detection piece 33 and the proximity switch face each other.

The bracket 12 further includes a pin 40, and one end of a first wire 41 is connected to the pin 40. The other end of the first wire 41 is passed around the first roller 16, second roller 17, third roller 18 and fourth roller 28 (in that order) and connected to a screw 42 that is fixed to the slider 27.

A second wire 43 is connected at its one end to the swing member 29. The wire 43 is on the opposite side from the coil spring 32 on the swing member 29. The other end of the second wire 43 is passed around the first roller 16 and third roller 18 (in this order) and connected to a small screw 44 which is fixed to the slider 27.

The operation of the pusher device 10 will be described below.

Figure 3:
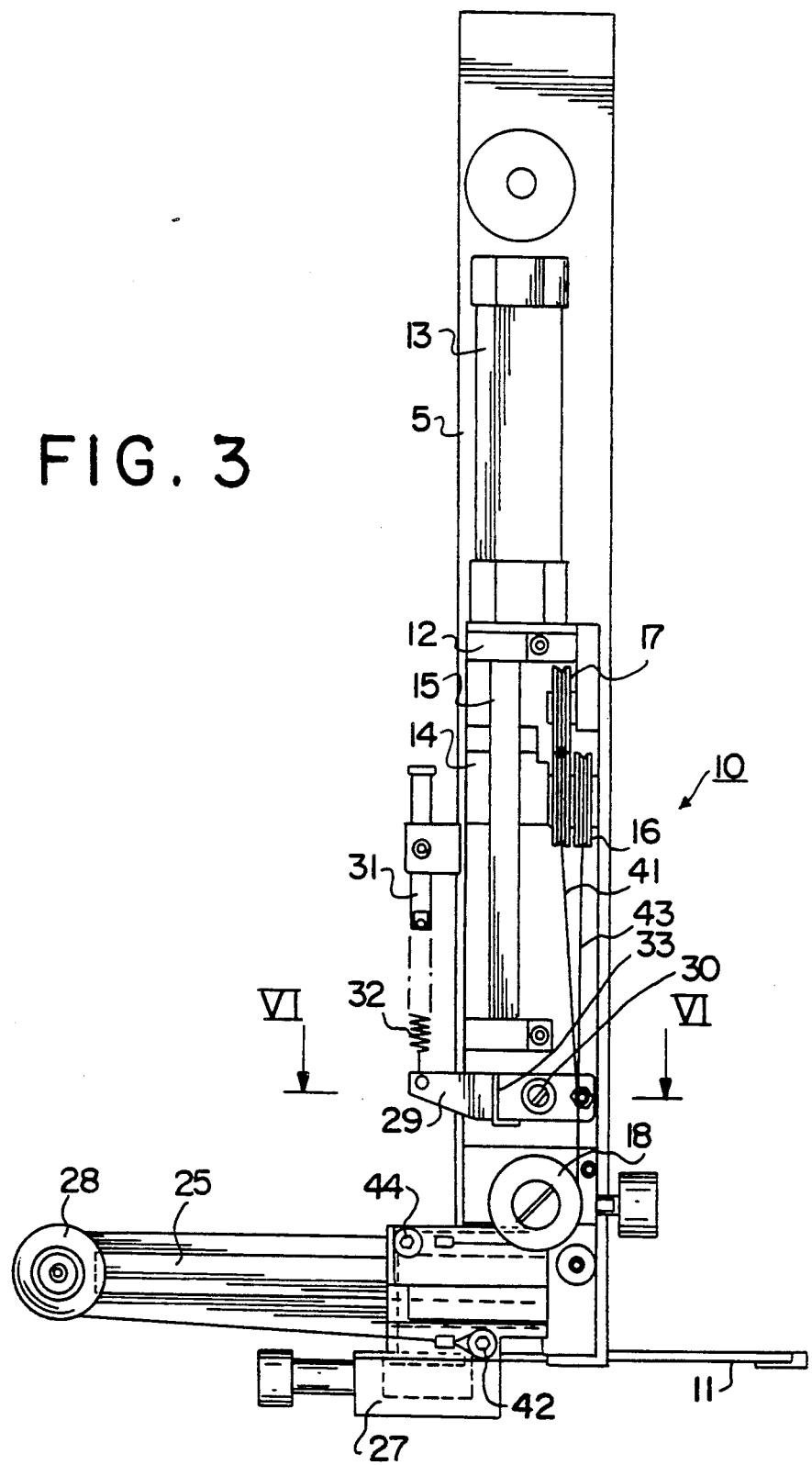
FIG. 3 is a front view of one embodiment of the pusher used in the supply device of FIGS. 1 and 2.
Figure 4:
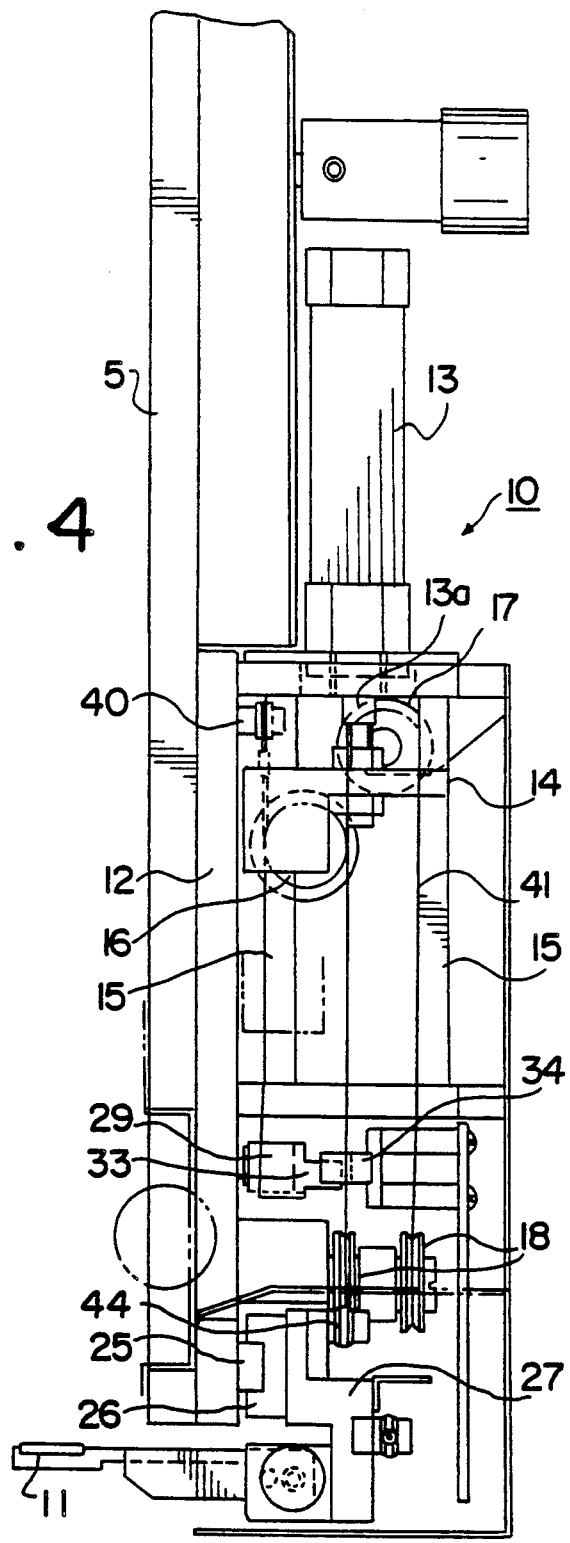
FIG. 4 is a left-side view thereof.
Figure 5:
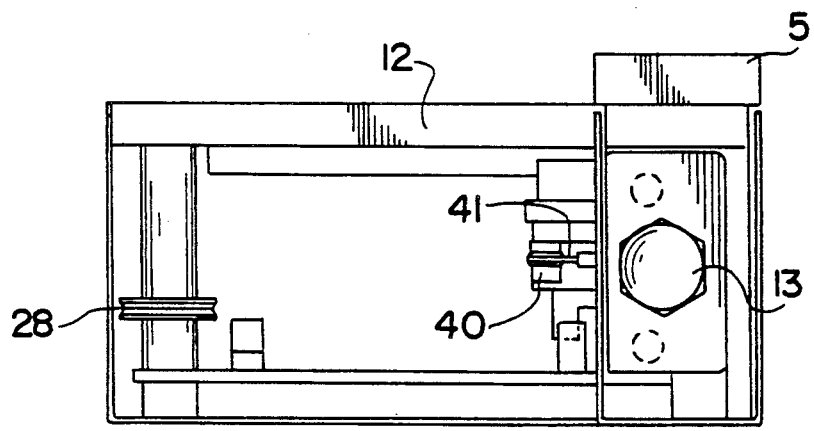
FIG. 5 is a top view thereof.
Figure 6:
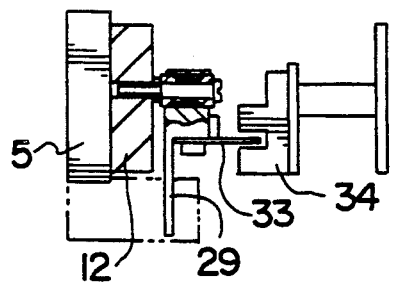
FIG. 6 is a cross sectional view taken along the line VI—VI of FIG. 3.

FIGS. 3 and 4 show the pusher arm 11 moved forward or advanced. Form this position, when the air cylinder 13 is actuated via an air-pressure control circuit (not shown) and the piston 13a of the air cylinder 13 is extended downward from this position, the bridge member 14 is lowered and therefore the first roller 16 is also lowered.

As a result of the lowering motion of the first roller 16, the first wire 41 is pulled, and the slider 27 is moved in the direction which causes the pusher arm 11 to be retracted (or to move backward). At this point, conversely, the second wire 43 follows the movement of the slider 27 and is fed out as a result of the lowering motion of the first roller 16. Normally, the pusher arm 11 is actuated from this retracted position as described above.

When the piston 13a is retracted (or moved up), in other words, when the pusher arm 11 is actuated from the retracted position, the first roller 16 is raised along with the bridge member 14. As a result of the upward movement of the first roller 16, the second wire 43 is pulled out, and the slider 27 moves in the direction that causes the pusher arm 11 to advance. In this case, the first wire 41 is fed out as a result of the upward movement of the first roller 16 and thus follows the movement of the slider 27.

In this way, the pusher arm 11 that repeats advancing and retracting movements successively pushes the workpieces 50 accommodated in the magazine 6 (which is raised and lowered at fixed intervals while being guided and supported by the fixed guide 4 and movable guide 5) out onto the feeder assembly 2.

If by some chance a workpiece 50 which the advancing pusher arm 11 is pushing out should become hung up inside the magazine 6 or on the feeder assembly 2 and an excess load is resulted onto to the pusher arm 11, the swing member 29 will swing against the driving force of the coil spring 32 as the first roller 16 moves upward. As a result of the swing motion of this swing member 29, the detection piece 33 activates the proximity switch 34 so that the excessive load is detected. With the resulting detection signal from the detection piece 33, the action of the driving source is stopped or reversed, so that the pusher arm 11 is either stopped in its advancing motion or retracted. Thus, the damage to the workpiece is prevented.

Since the air cylinder 13 which drives the driving source of the movable guide 5 is installed in such a way that the cylinder 13 is oriented in the direction of stacking or piling up of the workpiece in the magazine 6, the apparatus can be made compact, saving installation space. This design is also effective when applied to an apparatus in which the pusher device 10 is fastened to a fixed position of the elevator section 7 (as seen in conventional examples).

Furthermore, in the present invention the coil spring 32 and swing member 29 are attached to the first wire 41 and second wire 43 (which constitute the action-linking means that transmits the action of the air cylinder 13 to the pusher arm 11). In addition, the displacement of the swing member 29 which is caused by the deformation of the coil spring 32 is detected by the proximity switch 34. Accordingly, damage to the workpieces resulting from overload (that is caused by hanging up of the workpieces) can be prevented. This design is also effective when applied to an apparatus in which the pusher device 10 is provided to a fixed position of the elevator part 7 (as seen in conventional examples) or when applied to an apparatus in which the air cylinder 13 is installed horizontally.

In the above-described embodiment, the air cylinder 13 is used as a driving source; however, a motor, etc. can be used to drive the wires 41 and 43.

As is clear from the above description, according to the present invention:

(a) the magazine stacker is built with a fixed guide and a movable guide, and this movable guide is positionally adjustable in the direction in which the workpieces are pushed out. Also, the pusher is provided on the movable part. Accordingly, no independent adjustment of the pusher is required when there is a change in the size of the workpieces.

The driving source for the pusher device is installed so that it is oriented in the direction of stacking or piling up of the workpieces in the magazine, the overall size of the apparatus can be compact, thus providing a good space efficiency.

The elastic member and linking member are installed in the action-linking means which transmits the action of the driving source to the pusher arm. In addition, a detection means that detects the displacement of the linking member caused by the deformation of the elastic member is employed. Accordingly, damage to the workpieces can be prevented by detecting (via the detection means) overload resulting from hanging up of the workpieces, etc.

We claim:

1. A workpiece supply device used in a semiconductor assembly apparatus, said workpiece supply device comprising:
    an elevator means comprising an elevator table that is raised and lowered and a magazine which accommodates plate-form workpieces therein in a stacked manner coupled to said elevator table;
    a magazine stacker means coupled to said elevator means for guiding said magazine; and
    a pusher means including a pusher arm which pushes said workpieces out of said magazine one at a time and a driving source which drives said pusher arm; and wherein
    said magazine stacker means comprises a fixed guide means fixed to said elevator table and a movable guide means movably coupled to said elevator table facing said fixed guide means so as to be movable in a direction in which said workpieces are pushed out of said magazine;
    said pusher means is provided on and movable with said movable guide; and
    said driving source is provided such that said driving source is oriented in a direction of stacking of said workpieces in said magazine.

2. A workpiece supply device according to claim 1, wherein said driving source is supplied by an air cylinder.

3. A workpiece supply device according to claim 1 further comprising an elastic member and a linking member provided in an action-linking means which transmits said driving force from said driving source to said pusher arm and a detection means for detection displacement of said linking member caused by deformation of said elastic member.

* * * * *